United States Patent [19]
Aubuchon et al.

[11] Patent Number: 5,793,616
[45] Date of Patent: Aug. 11, 1998

[54] COMPUTER SYSTEM WITH SPECIAL CIRCUIT BOARD ARRANGEMENT

[75] Inventors: Mark S. Aubuchon, Spring; John C. Barker, Houston, both of Tex.

[73] Assignee: Compaq Computer Corp., Houston, Tex.

[21] Appl. No.: 829,152

[22] Filed: Mar. 31, 1997

[51] Int. Cl.[6] ...................................................... H05K 1/14
[52] U.S. Cl. ........................ 361/784; 361/790; 361/803; 361/785; 361/684; 361/683; 361/685; 439/91; 439/66; 439/928; 439/160
[58] Field of Search ..................... 361/784, 743, 361/744, 745, 790, 774, 771, 779, 803, 683, 686, 724, 785, 788, 792, 796, 802, 679, 687, 798, 685, 684

[56] References Cited

U.S. PATENT DOCUMENTS

| | | | |
|---|---|---|---|
| 4,979,075 | 12/1990 | Murphy | 361/686 |
| 5,253,246 | 10/1993 | Leonhardt et al. | 369/291 |
| 5,338,214 | 8/1994 | Steffes et al. | 439/160 |
| 5,438,476 | 8/1995 | Steffes | 361/683 |
| 5,513,329 | 4/1996 | Pecone | 395/281 |
| 5,572,400 | 11/1996 | Roesner et al. | 361/683 |
| 5,604,871 | 2/1997 | Pecone | 395/281 |
| 5,605,463 | 2/1997 | MacGregor et al. | 439/64 |
| 5,650,911 | 7/1997 | Scholder et al. | 361/684 |

*Primary Examiner*—Leo P. Picard
*Assistant Examiner*—David Foster
*Attorney, Agent, or Firm*—Jenkens & Gilchrist

[57] ABSTRACT

A computer system includes a chassis having a generally planar floor plate; a first generally planar motherboard having circuitry thereon mounted on the floor plate; at least one riser board connected to the first motherboard to extend generally orthogonally upwardly therefrom, the riser board having an upper edge oriented generally parallel to and above the plane of the first motherboard, and being provided with electrical circuit contacts along the upper edge; and a second generally planar motherboard connected to and at least partly supported by the riser board, the second motherboard being positioned adjacent the upper edge of the riser board, the second motherboard having circuitry thereon electrically connected to the electrical circuit contacts along the upper edge of the riser board.

12 Claims, 8 Drawing Sheets

COMPUTER SYSTEM WITH SPECIAL CIRCUIT BOARD ARRANGEMENT

BACKGROUND OF THE INVENTION

1. Field of the Invention

This invention relates to a computer system and, more particularly, to a computer system having specially arranged motherboards and riser boards which provide ease of manufacture, efficient use of the available package or cabinet volume, and great flexibility for the process of expanding the capability of such a computer system from one model to successive models.

2. Description of Related Art

In the design and manufacture of computer systems, particularly of the personal computer ("PC") type, there is great pressure to utilize the space or volume within the external packaging for the electronic components of the system efficiently. It is also desirable to have a generally modular design philosophy so that entire major functions may be added to a computer system as the product line evolves. For example, current design efforts include the addition of video or television capability to personal computer systems so that one set of equipment may alternately be used as a computer or as a television or video set. Conventional arrangements of motherboards, riser boards and daughter boards, together with the components they generally carry, are not necessarily calculated to make the most efficient use of the space or volume within an external package or cabinet, which package may have initially been designed and dimensioned to enclose a much simpler form of the system. There is, thus, a need to simplify the arrangement of boards to gain commensurate simplicity in manufacturing and to make use of the space or volume available in the most efficient manner.

SUMMARY OF THE INVENTION

In accordance with the invention, there is provided a computer system which includes a chassis having a generally planar floor plate on which a first generally planar motherboard having circuitry and/or components thereon is mounted. At least one riser board is connected to the first motherboard so as to extend generally orthogonally upwardly therefrom, and this riser board has an upper edge oriented generally parallel to and above the plane of the first motherboard. The riser board is provided with electrical circuit contacts along its upper edge. There is a second generally planar motherboard connected to and at least partly supported by the riser board, the second motherboard being positioned adjacent the upper edge of the riser board. The second motherboard has circuitry and/or components thereon electrically connected to the electrical circuit contacts along the upper edge of the riser board.

A preferred form of the computer system also has mounting connectors for expansion boards mounted on the riser board. It is also preferred that the computer system be one in which the circuitry and/or components on the first motherboard are designed and arranged to perform a first set of functions in the computer system and in which the circuitry and/or components on the second motherboard are designed and arranged to perform a second set of functions in the computer system.

In still another preferred form of the invention, a computer system having the general characteristics just described also includes a third motherboard mounted on the chassis generally parallel to and above the first motherboard and below the upper edge of the riser board, the third motherboard having an opening therein (preferably a slot), and with the riser board arranged to pass through the opening.

In some arrangements, the computer system is one in which the chassis has a back panel extending generally upwardly from the floor plate of the chassis, and with this kind of arrangement connectors and/or components are preferably mounted on the back panel, and at least some of the back panel connectors and/or components are electrically connected to circuitry on the first motherboard and at least some of the back panel connectors and/or components are electrically connected to circuitry on the second motherboard.

A particularly advantageous form of the invention is a computer system of the kind described above in which the second motherboard extends across the upper edge of the riser board. However, the second motherboard may also be arranged to extend laterally from one side of the top edge of the riser board, and furthermore an additional motherboard may be arranged to extend laterally from the other side of the top edge of the riser board if there is a need or desire for such an additional board.

In most instances, the computer system will be one in which the chassis and the first motherboard are generally rectangular, and the second motherboard is generally rectangular.

BRIEF DESCRIPTION OF THE DRAWINGS

The manner in which the foregoing structures and features of the computer system of the invention are arranged may be more fully understood from a consideration of the detailed description which follows, and the accompanying drawings wherein.

DETAILED DESCRIPTION OF THE PREFERRED EMBODIMENT

Figure 1:
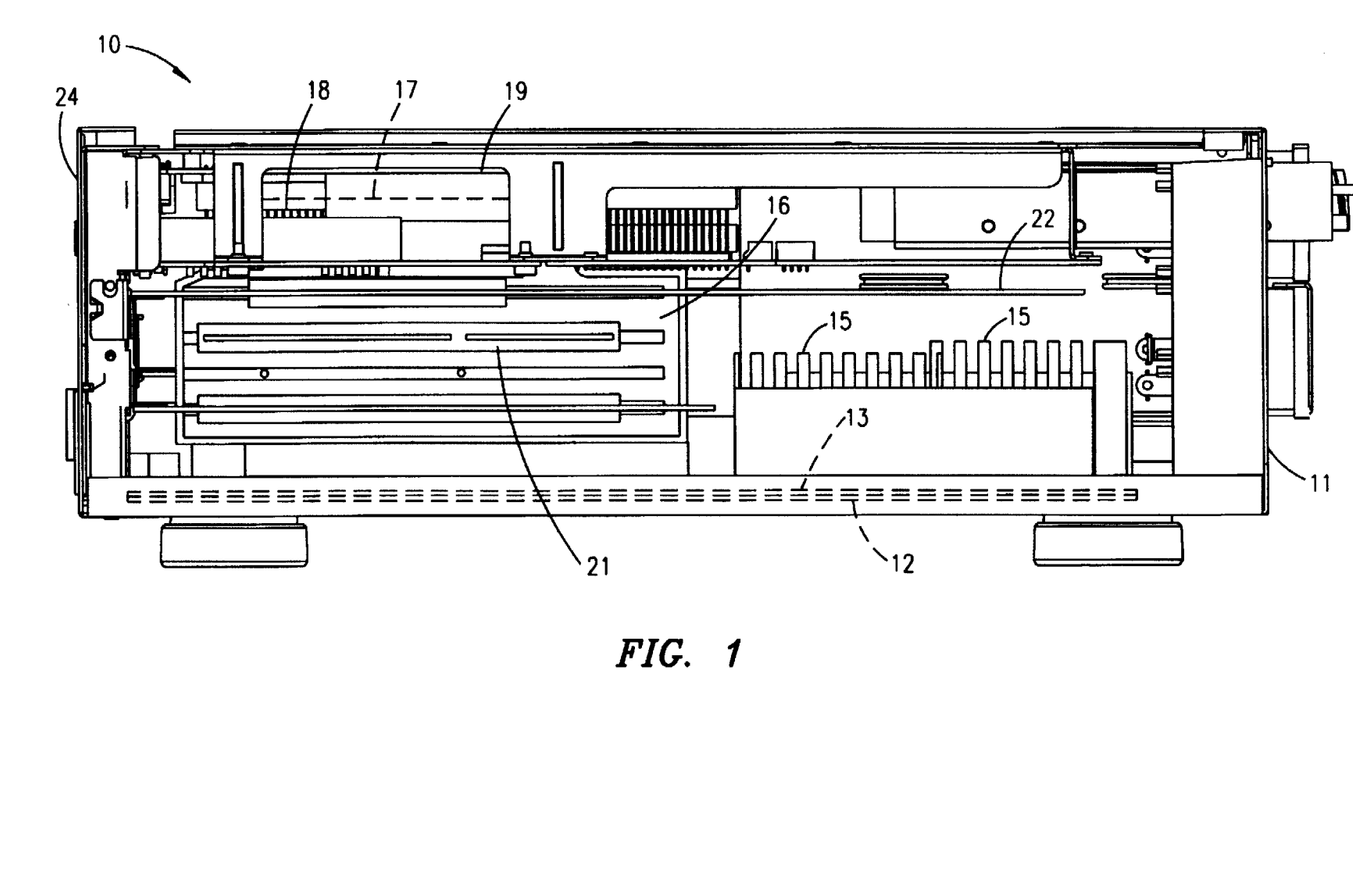
FIG. 1 is a side sectional elevational view of a computer system constructed in accordance with the invention.
Figure 2:
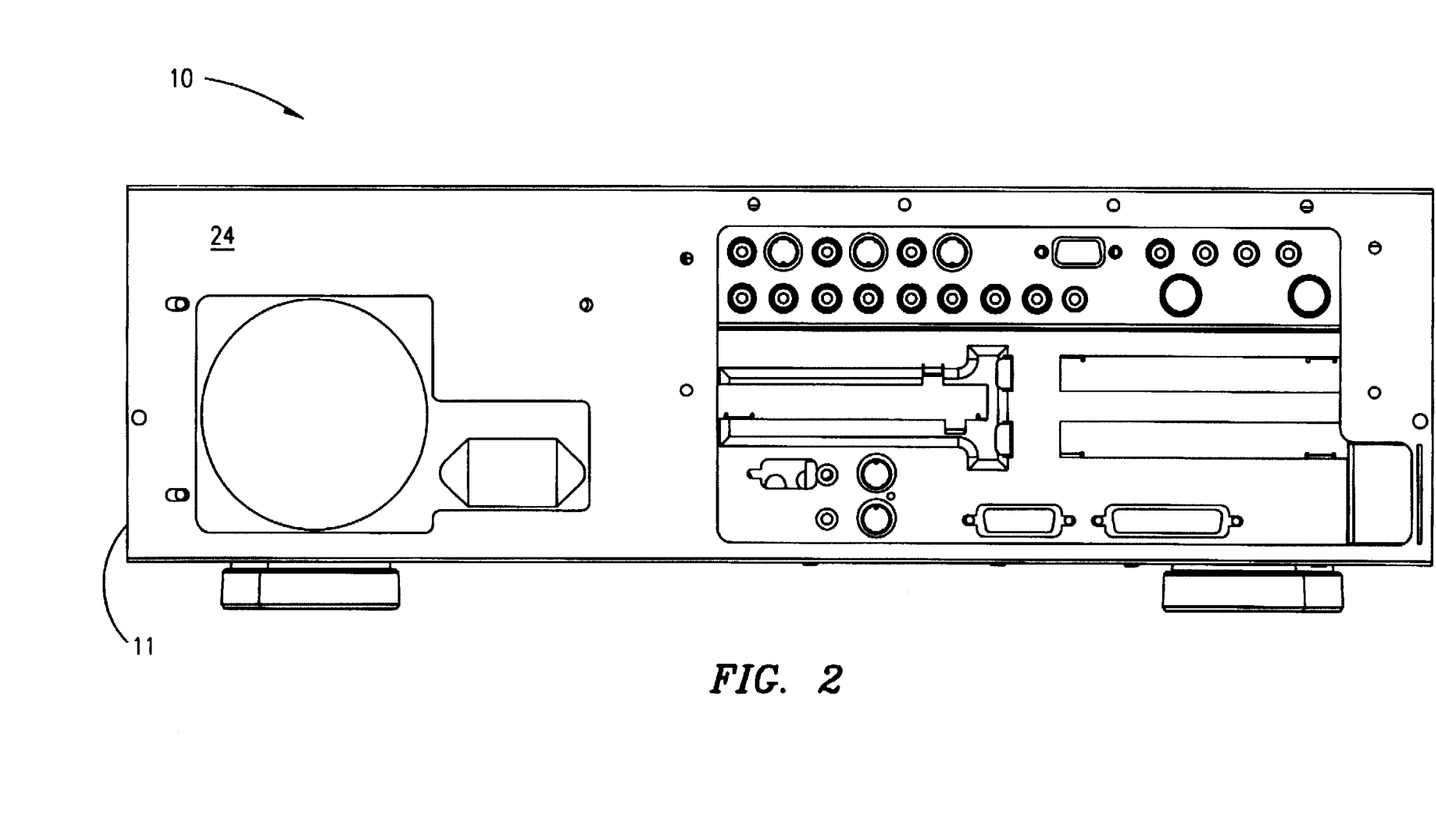
FIG. 2 is a rear elevational view of the computer system of FIG. 1.
Figure 3:
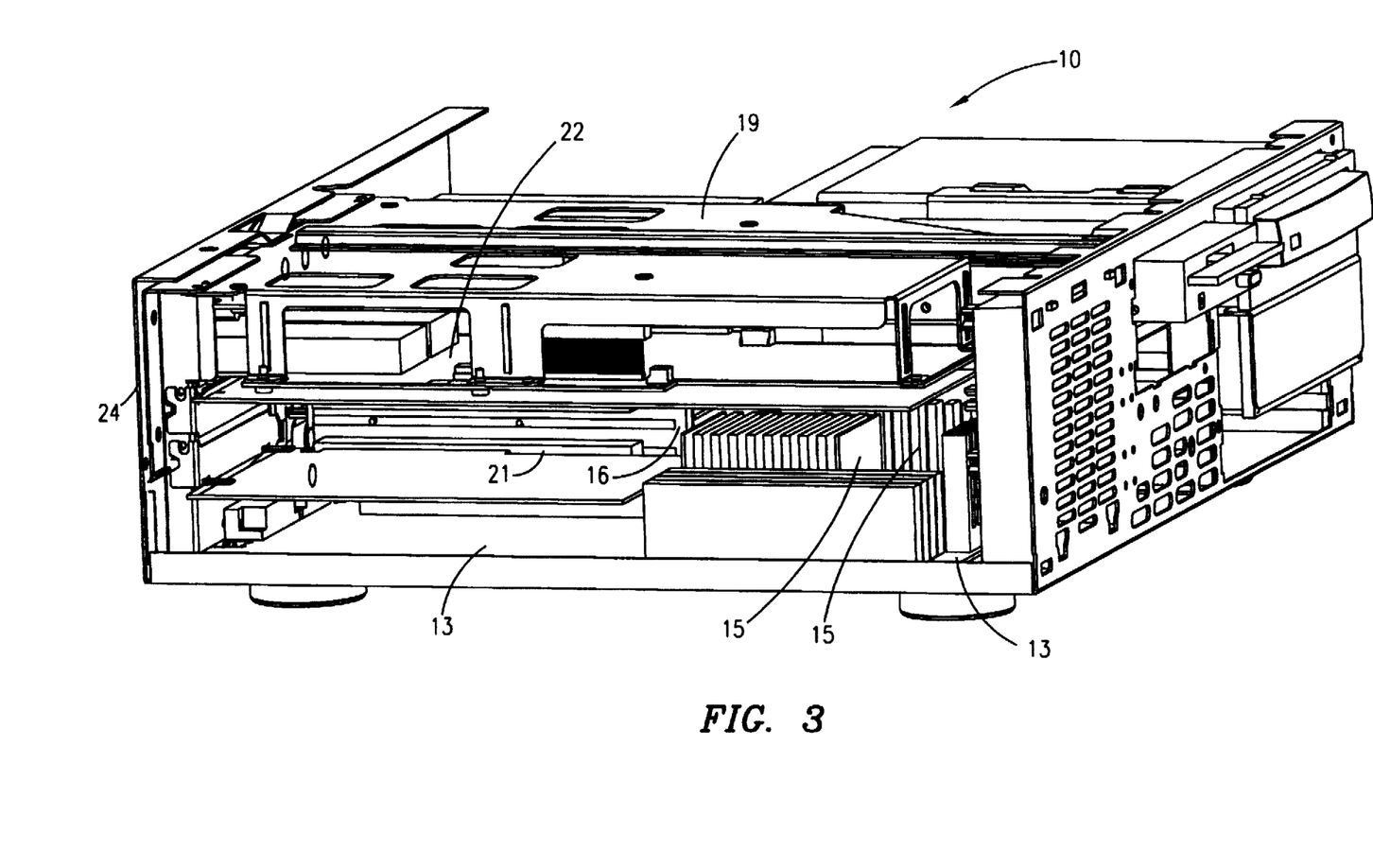
FIG. 3 is a perspective view looking from the side of the computer system of FIGS. 1 and 2 with parts removed or broken away for the sake of clarity.
Figure 4:
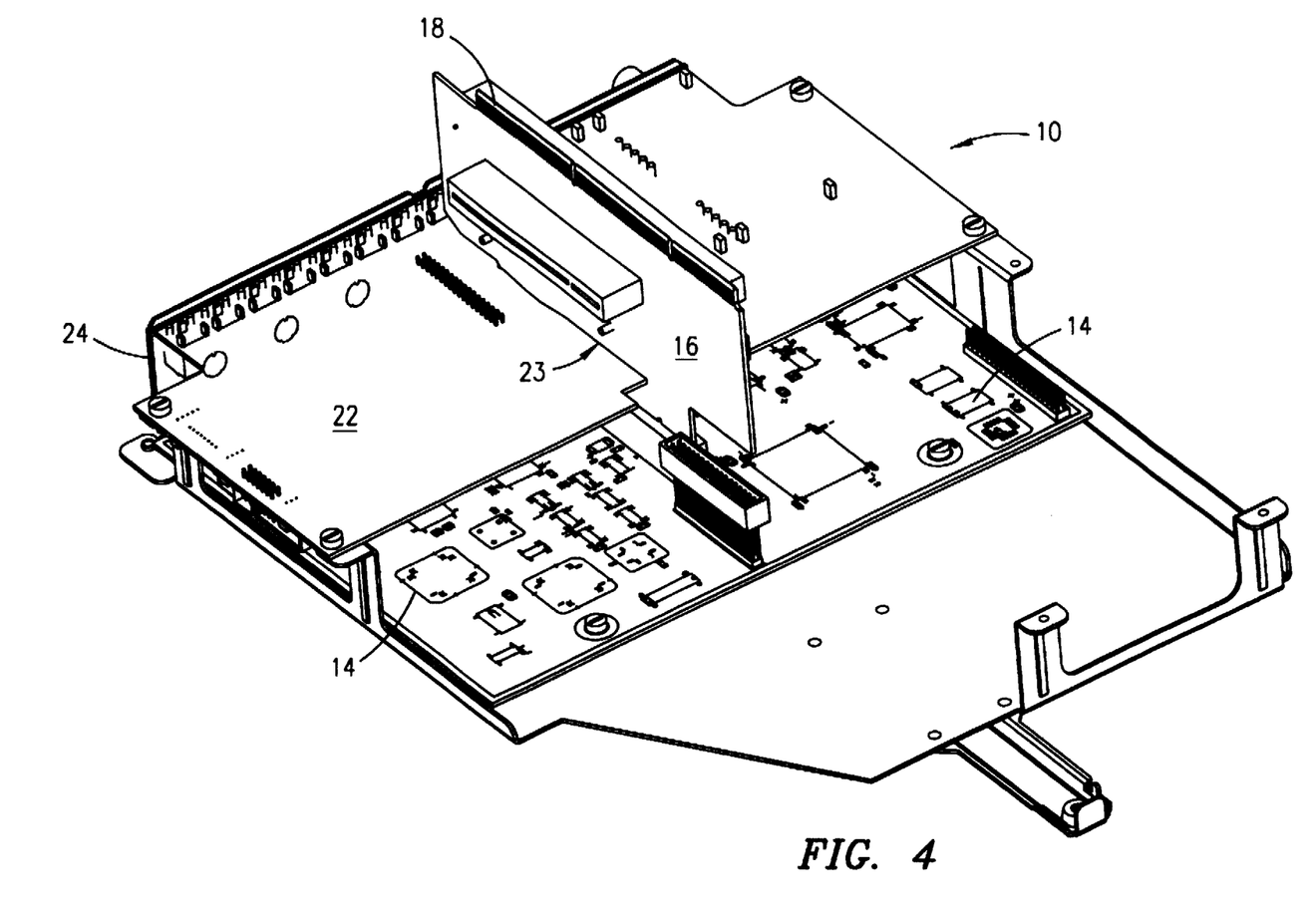
FIG. 4 is a perspective view of the computer system of FIG. 1 looking from above and in front of the unit, with parts removed for the sake of clarity in illustration.
Figure 5:
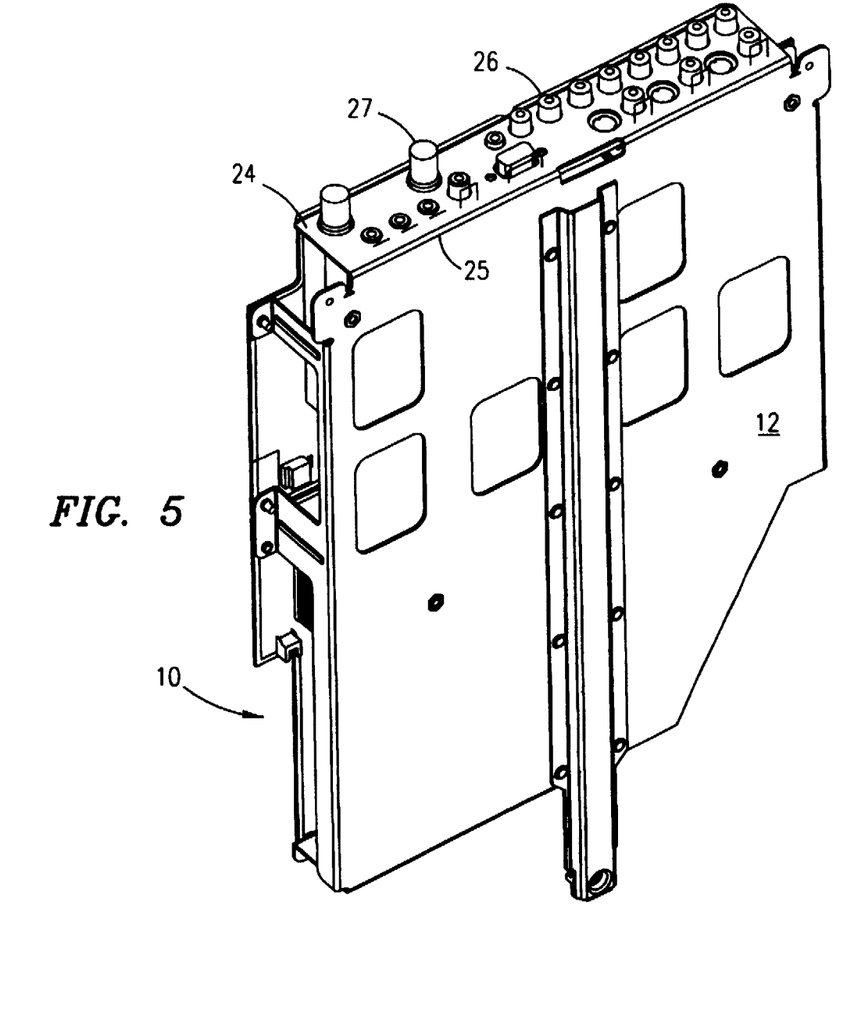
FIG. 5 is a perspective view of the portion of the computer system shown in FIG. 4, but from behind and below the computer system.
Figure 6:
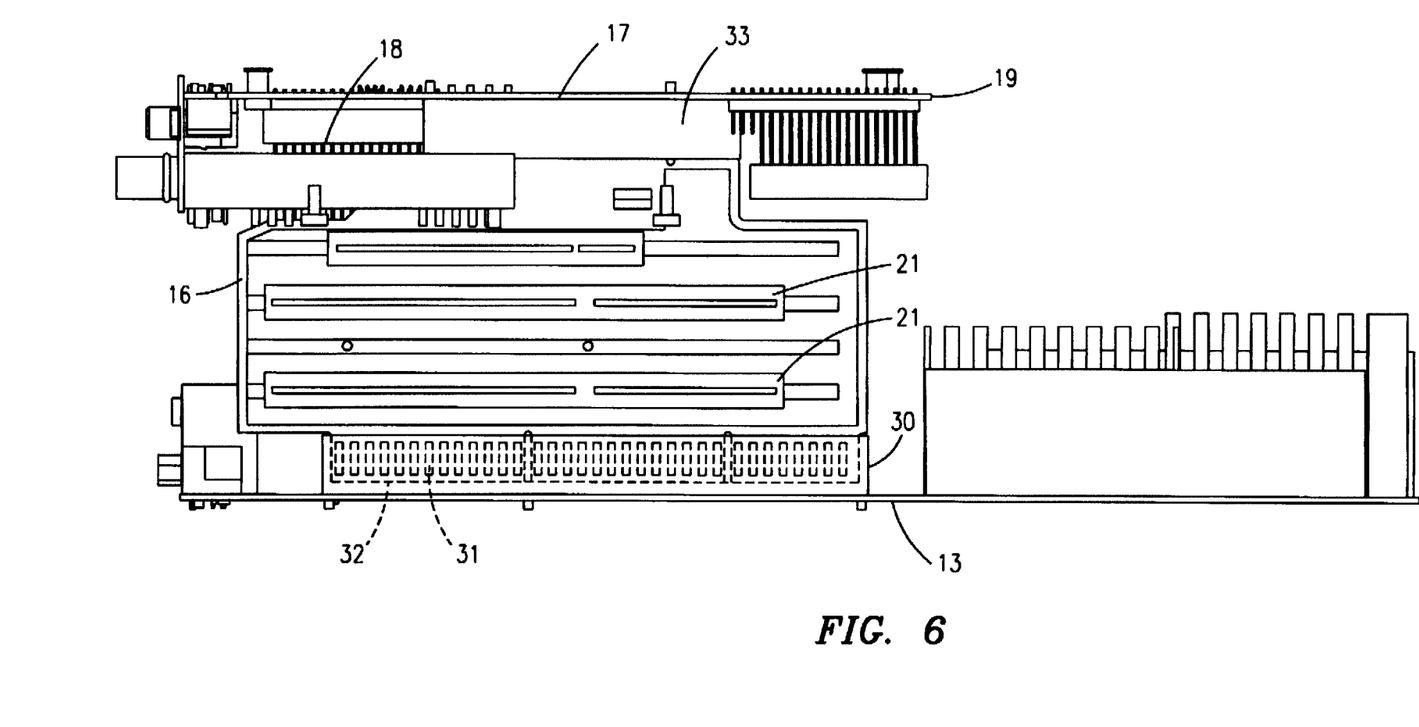
FIG. 6 is a side elevational view, partly in section, showing a riser card of the invention, together with portions of two motherboards.
Figure 8:
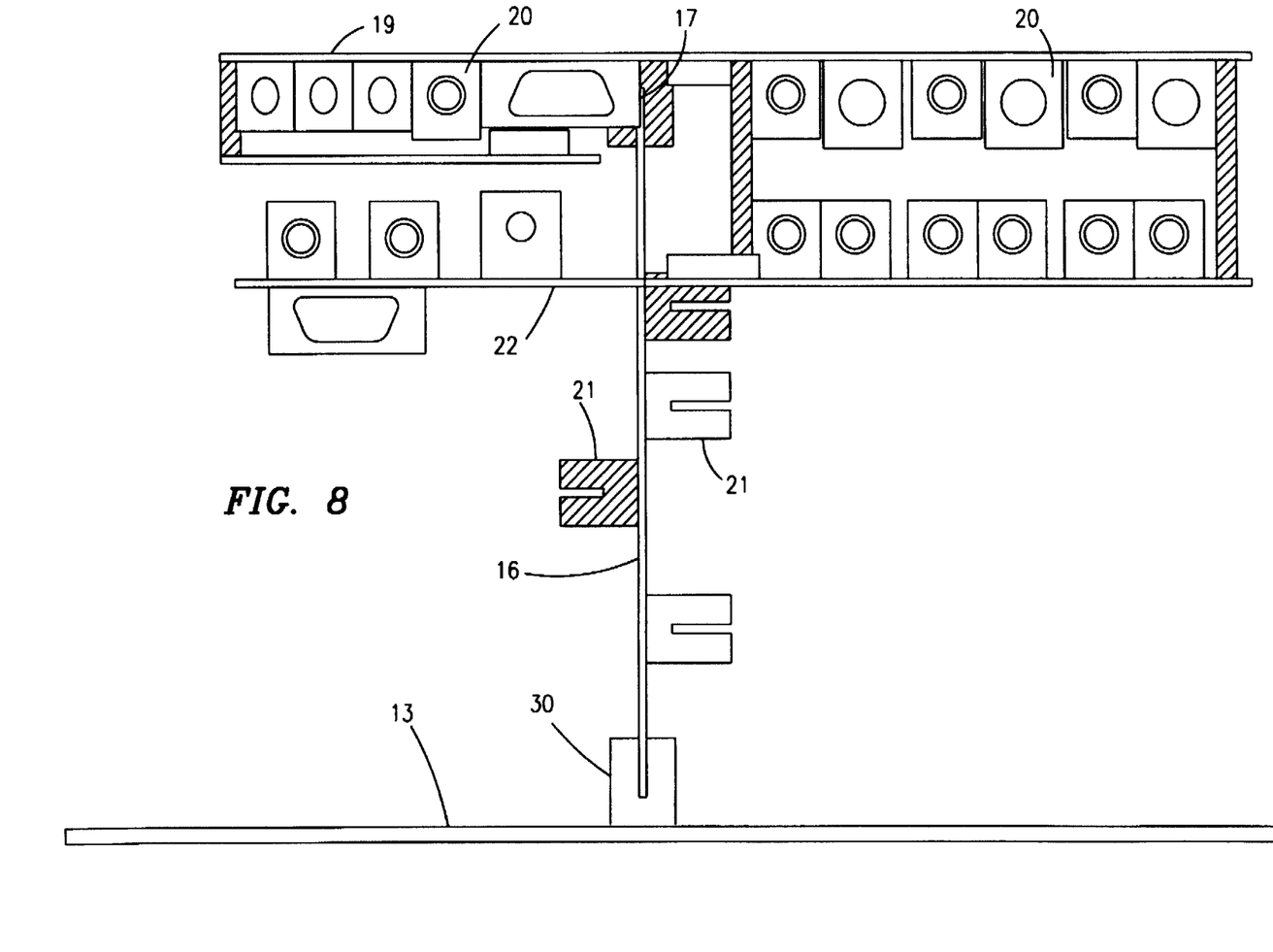
FIG. 8 is a view similar to FIG. 7 showing an arrangement of circuit cards for a computer system arranged in accordance with the invention.

In FIGS. 1–5, a computer system designated generally as 10 embodying the principles of the invention is shown. It includes a chassis 11 which has a generally planar floor plate 12. On the floor plate 12, a first generally planar motherboard 13 is mounted. It has circuitry (indicated diagrammatically at 14, FIG. 4) and/or components 15 mounted on it. In accordance with the invention, at least one riser board 16 is connected to the first motherboard and it extends generally orthogonally upwardly therefrom. Riser board 16 has an upper edge 17 oriented generally parallel to and above the plane of first motherboard 13, and is provided with electrical circuit contacts 18 along upper edge 17. As shown best in FIG. 6, riser board 16 is mounted to first motherboard 13 by connector 30, which engages it and the contacts 31 along its lower edge 32. There is a second generally planar motherboard 19 connected to and at least partly supported by riser board 16 (and others, if any additional riser boards are present). The second motherboard 19 is positioned adjacent the upper edge 17 of riser board 16, and circuitry and/or components 20 (such as shown in FIG. 8) thereon electrically connected to the electrical circuit contacts 18 along the upper edge 17 of riser board 16. As shown best in FIG. 6, connector 33 provides both a structural connection between riser board 16 and second motherboard 19, and electrical connections between the circuitry on these two boards (16 and 19) by gripping electrical circuit contacts 18. Mounting connectors 21 for expansion boards are mounted on riser board 16. Chassis 11 and first motherboard 13 are generally rectangular, and second motherboard 19 is also generally rectangular.

The circuitry 14 (see FIG. 4) and/or components 15 (see FIGS. 1 and 3) on the first motherboard 13 are preferably designed and arranged to perform a first set of functions in the computer system and the circuitry and/or components 20 (see FIG. 8) on the second motherboard are preferably designed and arranged to perform a second set of functions in the computer system.

The computer system also has a third motherboard 22 mounted on chassis 11 generally parallel to and above first motherboard 13 and below the upper edge 17 of riser board 16, the third motherboard having an opening or slot 23 therein, and riser board 16 passing through opening 23.

The computer system chassis 11 has a back panel 24 extending generally upwardly from floor plate 12 along an edge 25 thereof. There are connectors 26 and/or components 27 mounted on back panel 24, and at least some of the back panel connectors and/or components are electrically connected to circuitry on first motherboard 13, and at least some of back panel connectors 26 and/or components 27 are electrically connected to circuitry on second motherboard 19.

It is preferred that second motherboard 19 extend across the upper edge of the riser board, as shown best in FIG. 8, but it should be noted that second motherboard 19 may extend laterally from one side of the top edge of the riser board, and that an additional motherboard (not shown) may extend laterally from the other side of the top edge 17 of the riser board.

Figure 7:
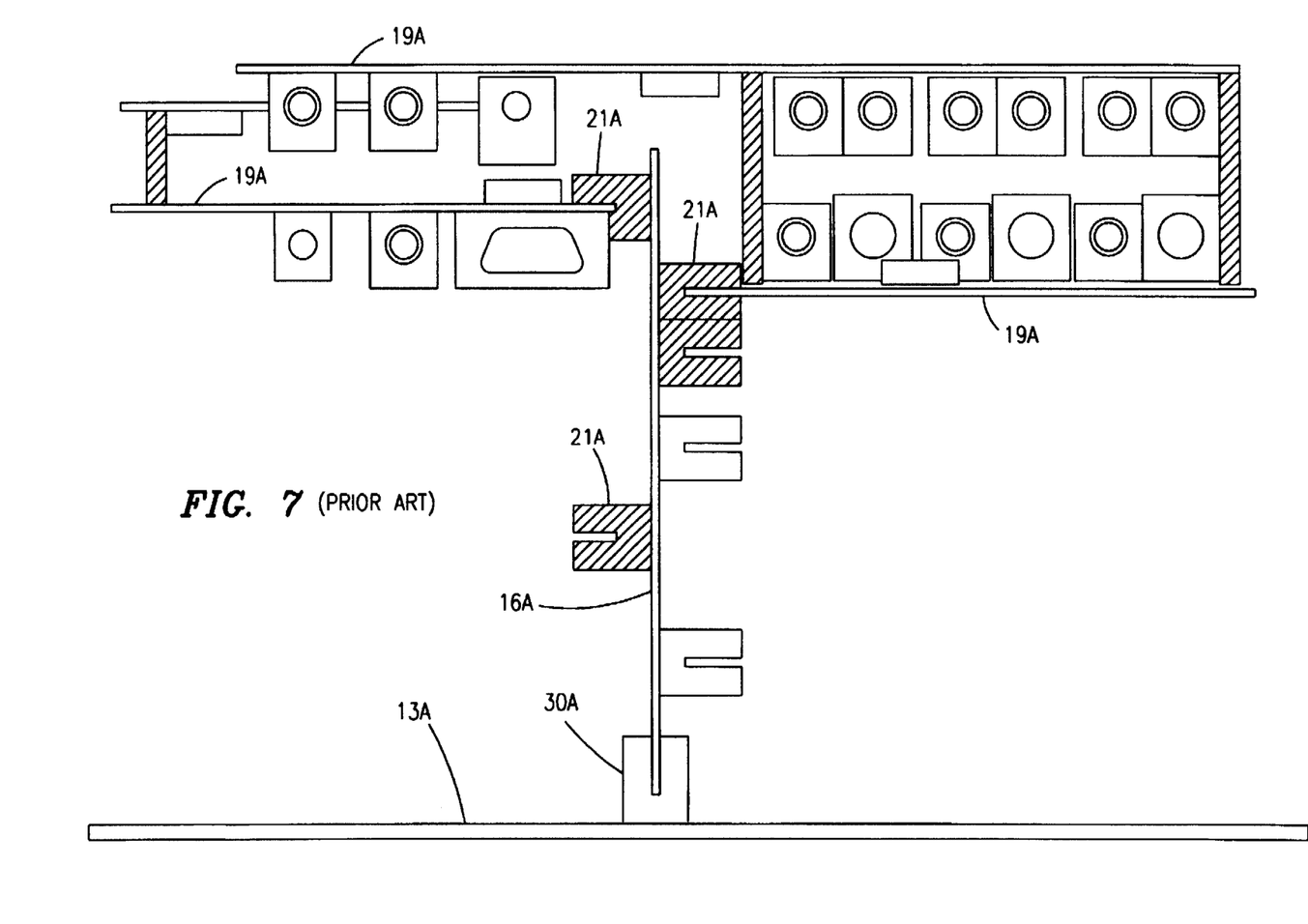
FIG. 7 is a somewhat diagrammatic end elevational view of an arrangement of circuit cards for a computer system arranged in accordance with the prior art.

Attention is now directed to somewhat diagrammatic end elevational views of FIGS. 7 and 8, from a comparison of which important features of the invention may be understood. FIG. 7 shows a prior art practice, with a first motherboard 13A supporting a riser board 16A through a connector 30A. Outwardly facing expansion connectors 21A are provided on the riser board. There are no contacts at the top edge of riser board 16A, but rather the uppermost of the connectors 21A carry, directly and indirectly, additional motherboards 19A.

By contrast, FIG. 8 illustrates boards arranged in accordance with the invention. First motherboard 13 supports riser board 16, which has electrical contacts along its upper edge. Second motherboard 19 is mechanically and electrically connected to the riser board 16 by connector 17, and extends across the top of riser board 16. Additional or third motherboard 22 is also provided. A comparison of FIGS. 7 and 8 readily reveals that the arrangement of the invention is simpler and more robust mechanically and occupies significantly less volume.

Obviously, numerous modifications and variations are possible in view of the teachings above. Accordingly, the present invention should not be considered to be limited by the description above, but rather only by the appended claims.

What is claimed is:

1. A computer system comprising:

a chassis having a generally planar floor plate;

a first generally planar motherboard having circuitry thereon mounted on said floor plate;

at least one riser board connected to said first motherboard to extend generally orthogonally upwardly therefrom;

said riser board having an upper edge oriented generally parallel to and above the plane of said first motherboard, and being provided with electrical circuit contacts along said upper edge; and a second generally planar motherboard connected to and at least partly supported by said riser board, said second motherboard being positioned adjacent the upper edge of said riser board, said second motherboard having circuitry thereon electrically connected to the electrical circuit contacts along the upper edge of said riser board.

2. A computer system in accordance with claim 1 and further comprising mounting connectors for expansion boards mounted on said riser board.

3. A computer system in accordance with claim 1 in which said circuitry on said first motherboard is designed and arranged to perform a first set of functions in said computer system and in which said circuitry on said second motherboard is designed and arranged to perform a second set of functions in said computer system.

4. A computer system in accordance with claim 1 and further comprising a third motherboard mounted on said chassis generally parallel to and above said first motherboard and below said upper edge of said riser board, said third motherboard having an opening therein, and said riser board passing through said opening.

5. A computer system in accordance with claim 1 in which said opening is a slot.

6. A computer system in accordance with claim 1 in which said chassis has a back panel extending generally upwardly from said floor plate along an edge thereof.

7. A computer system in accordance with claim 6 and further comprising:

connectors mounted on said back panel, at least some of said back panel connectors being electrically connected to circuitry on said first motherboard and at least some of said back panel connectors being electrically connected to circuitry on said second motherboard.

8. A computer system in accordance with claim 1 in which said second motherboard extends across the upper edge of said riser board.

9. A computer system in accordance with claim 1 in which said second motherboard extends laterally from one side of the top edge of said riser board.

10. A computer system in accordance with claim 9 and further comprising an additional motherboard extending laterally from the other side of the top edge of said riser board.

11. A computer system in accordance with claim 1 in which said chassis and said first motherboard are generally rectangular.

12. A computer system in accordance with claim 11 in which said second motherboard is generally rectangular.

* * * * *